United States Patent
Fukaya

(10) Patent No.: US 9,063,427 B2
(45) Date of Patent: Jun. 23, 2015

(54) PHOTOMASK BLANK AND MANUFACTURING METHOD THEREOF

(71) Applicant: Shin-Etsu Chemical Co., Ltd., Chiyoda-ku (JP)

(72) Inventor: Souichi Fukaya, Niigata (JP)

(73) Assignee: SHIN-ETSU CHEMICAL CO., LTD., Chiyoda-ku (JP)

( * ) Notice: Subject to any disclaimer, the term of this patent is extended or adjusted under 35 U.S.C. 154(b) by 176 days.

(21) Appl. No.: 13/790,769

(22) Filed: Mar. 8, 2013

(65) Prior Publication Data

US 2013/0288163 A1 Oct. 31, 2013
US 2014/0120460 A2 May 1, 2014

(30) Foreign Application Priority Data

Apr. 26, 2012 (JP) ................................. 2012-100821

(51) Int. Cl.
*G03F 1/50* (2012.01)
*G03F 1/68* (2012.01)
*G03F 1/26* (2012.01)

(52) U.S. Cl.
CPC ...... *G03F 1/26* (2013.01); *G03F 1/50* (2013.01)

(58) Field of Classification Search
CPC ............... G03F 1/26; G03F 1/58; G03F 1/68
USPC ............................................. 430/5, 322, 323
See application file for complete search history.

(56) References Cited

U.S. PATENT DOCUMENTS

| 5,474,864 | A | 12/1995 | Isao et al. |
| 2002/0098422 | A1 | 7/2002 | Nozawa |
| 2004/0110073 | A1 | 6/2004 | Kaneko et al. |
| 2005/0260505 | A1* | 11/2005 | Fukushima et al. ............. 430/5 |
| 2007/0092807 | A1* | 4/2007 | Fukushima et al. ............. 430/5 |

FOREIGN PATENT DOCUMENTS

| JP | 7-140635 | 6/1995 |
| JP | 2002-229183 | 8/2002 |
| JP | 2003-50458 | 2/2003 |
| JP | 2004-199035 | 7/2004 |
| JP | 2005-331554 | 12/2005 |
| JP | 2006-195202 A | 7/2006 |
| JP | 2007-94435 A | 4/2007 |
| JP | 2010-66783 A | 3/2010 |

* cited by examiner

*Primary Examiner* — Stephen Rosasco
(74) *Attorney, Agent, or Firm* — Oblon, McClelland, Maier & Neustadt, L.L.P.

(57) ABSTRACT

An object of this invention is to provide a photomask blank in which there is little warpage and is which an amount of warpage change after a photomask manufacturing process ends is also small. First, a phase shift film is deposited (S101), next, the phase shift film is subjected to a heat treatment within a temperature range of 260° C. to 320° C. for four hours or more (S102), and thereafter a flash irradiation treatment is performed thereon (S103). A light-shielding film is deposited on the phase shift film after the aforementioned treatments (S104), to thereby obtain a photomask blank (S105).

10 Claims, 3 Drawing Sheets

PHOTOMASK BLANK AND MANUFACTURING METHOD THEREOF

BACKGROUND OF THE INVENTION

1. Field of the Invention

The present invention relates to a photomask blank, and more particularly to a photomask blank for manufacturing a photomask used in microfabrication of a semiconductor integrated circuit, a CCD (charge-coupled devices), a color filter for a liquid crystal display (LCD), a magnetic head and the like.

2. Description of the Related Art

In the field of semiconductor processing technology in recent years, there has been a demand for increasing miniaturization of circuit patterns to accompany increasing integration of large scale integrated circuits. To achieve such miniaturization, demands with respect to technology for thinning lines of wiring patterns that constitute such circuits as well as technology for miniaturizing contact hole patterns used for wiring between layers making up a cell are also becoming more severe. Consequently, in the manufacture of photolithography photomasks for forming these wiring patterns and contact hole patterns also, there is a demand for technology capable of writing finer circuit patterns with greater accuracy.

It is known that if a change in the shape of a photomask occurs when a pattern that has been drawn on the photomask is projected onto a resist film, the accuracy of the projection position of the pattern will decrease and result in a defective product. It has been clarified that it is necessary to control the substrate shape of the photomask to solve this problem (Patent Literature 1: Japanese Patent Laid-Open No. 2003-50458). Patent Literature 1 reports that by using a substrate having a specific surface shape as the substrate for manufacturing a photomask, a change in the surface shape can be suppressed when the photomask is fixed by suction on a mask stage of an exposure apparatus.

Conventionally, importance has been placed on the flatness of a transparent substrate for a photomask and a photomask blank. When an optical film such as a light-shielding film or a phase shift film is deposited on a transparent substrate for a photomask, the stress in the optical film is controlled so that the substrate shape does not change. Many reports exists regarding technology for suppressing the occurrence of "warpage", that is, a change in the shape of the substrate surface (for example, Patent Literature 2: Japanese Patent Laid-Open No. 2004-199035).

In addition, to correspond to further thinning of patterns, liquid immersion exposure or double patterning as well as technologies that combine these are in practical use. Here, the term "liquid immersion exposure" refers to a method that increases the accuracy of patterning by filling a space between the lens of a semiconductor exposure apparatus and a substrate that is the object of exposure (for example, a silicon wafer) with a liquid (for example, pure water with a refractive index of 1.44) that has a higher refractive index than air (refractive index of 1.00). The term "double patterning" refers to a method in which exposure is performed after dividing one circuit pattern into two low-density circuit patterns, in which the aforementioned two patterns are transferred in sequence onto a substrate. That is, after one of the circuit patterns is transferred, the other circuit pattern is transferred between the lines of the first circuit pattern, to thereby achieve a higher resolution.

For example, in a photomask for double patterning that corresponds to hp 32, approximately 3 to 4 nm is required as the superposition accuracy when exposing a resist that has been coated on a substrate. In addition to this requirement for a high degree of superposition accuracy, since the exposure light is short-wavelength light with a wavelength of 193 nm and the depth of focus (DOF) is therefore shallow, the photomask is required to have a high degree of flatness in order to achieve highly accurate patterning.

A phase shift method is available as one method that enhances the resolution without making the depth of focus shallow. According to the phase shift method, a photomask (phase shift mask) is used on which a pattern is formed so that there is a phase difference of approximately 180° between light that has passed through a phase shift section and light that has passed through a transparent section. Light that has passed through the phase shift section and light that has passed through the transparent section interfere with each other to form transmitted light with opposite phases. The phase shift method utilizes phase information of the transmitted light to improve the resolution performance. Note that, the types of phase shift masks include a Levenson-type mask and a halftone-type mask. Halftone phase shift masks have a comparatively simple structure and are widely use.

Masks that have a phase shift film made of molybdenum silicide oxide (MoSiO), molybdenum silicide oxynitride (MoSiON), or molybdenum silicide nitride (MoSiN) are used as halftone phase shift masks (Patent Literature 3: Japanese Patent Laid-Open No. 07-140635).

Such phase shift masks are formed by forming a pattern by electron beam lithography or photolithography on a principal surface of a phase shift mask blank. More specifically, a resist is coated on a phase shift film of the phase shift mask blank, a desired portion of the resist is exposed by electron beams or ultraviolet light, thereafter the resist is developed to obtain a resist pattern, and thus a phase shift film at the desired portion is exposed. Subsequently, the exposed portion of the phase shift film is removed by etching utilizing the resist pattern as a mask to expose the substrate face, and thereafter the resist pattern is peeled off to obtain the phase shift mask.

Generally, in a photomask blank, a functional transparent film such as a phase shift film is formed by sputtering. However, even when using a transparent substrate that exhibits a high degree of flatness when mounted on an exposure apparatus for use for manufacturing a photomask blank, a stress arises in the film during the film deposition process, and the stress causes strain of the substrate and induces warpage of the photomask blank. Further, when stress that has accumulated within a phase shift film or the like is released during the photomask manufacturing process, the warpage state of the substrate changes from the initial state of the selected transparent substrate due to release of the stress.

When this kind of change in the warpage amount of a substrate occurs during the photomask manufacturing process, it results in the loss of the flatness of the photomask at the time of exposure, and the effective DOF with respect to the pattern exposure decreases and becomes a factor that induces a resolution failure.

The above problem does not arise if film deposition is carried out under conditions such that stress within a functional transparent film such as a phase shift film becomes the same level as in other functional films. However, it is extremely difficult, and practically impossible, to find film deposition conditions which satisfy various characteristics required for a functional transparent film and which, at the same time, are also conditions for depositing a low stress film. Therefore, after depositing a film under conditions which satisfy various characteristics required for a functional transparent film, it is necessary to provide a further step for lowering the stress of the film.

The application of energy from outside is known as means for reducing such kind of in-film stress. A hot plate, a heater, a halogen lamp, an infrared lamp and the like can be used as specific energy applying means. When these means are used, if there is a large amount of stress accumulated in the functional transparent film it is necessary to apply an extremely large amount of heat energy to adequately release the stress. However, if the amount of heat energy that is applied to too great, the characteristics of the functional transparent film change and the functional transparent film does not perform its original function.

This disadvantage can be avoided by applying heat energy instantly by means of laser annealing. However, because laser light is light of a single wavelength, there is the problem that the result thereof depends on the light absorption rate that the functional transparent film has with respect to the laser light wavelength. (Patent Literature 4: Japanese Patent Laid-Open No. 2002-229183).

To solve this problem, a method is known that irradiates light from a flash lamp at a predetermined energy density to decrease the stress of a functional transparent film (Patent Literature 2: Japanese Patent Laid-Open No. 2004-199035). According to this method, by controlling an irradiation energy amount of light from a flash lamp to an appropriate amount, it is also possible to make the warpage amount of a halftone phase shift film that is a functional transparent film equal to or less than ±0.05 μm (Patent Literature 5: Japanese Patent Laid-Open No. 2005-331554). Further, after forming this kind of halftone phase shift film with a small warpage amount, a light-shielding film and an antireflection film that are other functional films are deposited to form a laminated body that is employed as a photomask blank.

SUMMARY OF THE INVENTION

The flatness (warpage amount) demanded for state-of-the-art photomask blanks is a measurement value of ±0.05 μm within a rectangular region in which one side is 132 mm that is centered on the middle of a principal surface of the photomask blank, and a more stricter requirement is a flatness of ±0.03 μm. Here, a case where a substrate is warped in a concave shape by strain that is accumulated in a film is taken as being a case of compressive stress, and the warpage amount is represented by "−" (minus). Further, a case where a substrate is warped in a convex shape by strain that is accumulated in a film is taken as being a case of tensile stress, and the warpage amount is represented by "+" (plus).

In addition, in order to accurately form a minute pattern, it is necessary to enhance the superposition accuracy of the photomask and the like, and it is necessary to suppress to a small amount the warpage change that occurs during the process of manufacturing a photomask with a photomask blank.

Heretofore, in a process for manufacturing a photomask, even when depositing a functional transparent film that has a large film stress of, for example, around 0.4 μm, it has been considered that if an appropriate amount of irradiation energy is applied by light from a flash lamp and a halftone phase shift film is also formed, the warpage amount can be suppressed to a low amount and the amount of warpage change in the halftone phase shift film in a photomask on which a pattern has been formed can be sufficiently suppressed. However, when such a product is actually used as a photomask, it has been found that the amount of warpage change in the halftone phase shift film from the photomask blank is ±0.06 μm.

The present inventors conducted concentrated studies to clarify the cause of the above problem, and traced the cause to the heat history applied when forming a resist pattern on the photomask blank for pattern formation of the photomask. Further, the present inventors found that when a phase shift film is formed, either before or after subjecting the phase shift film to a flash irradiation treatment, it is necessary to perform a heat treatment for a definite time period or more at a temperature that is equal to or greater than the heat history. The present inventors found that by performing the heat treatment, the amount of warpage change in a halftone phase shift film is reduced by half or more, and consequently found that the amount of warpage change in the halftone phase shift film when a photomask blank formed by a laminated body that includes the halftone phase shift film is used for a photomask is half or less relative to the conventional amount of warpage change.

An object of the present invention is to provide a photomask blank which has a high degree of flatness (that is, a low degree of warpage) and in which the amount of warpage change after a photomask manufacturing process ends is small.

To solve the above problems, a photomask blank according to the present invention is a photomask blank in which a laminated body including at least one kind of functional transparent film is formed on a substrate that is transparent to exposure light, wherein a heat treatment is performed on the laminated body at least one time after any one of: a step of depositing the functional transparent film; a step of performing a flash irradiation treatment at least one time after deposition of the functional transparent film; and a step of forming a layer of a functional film that is different to the functional transparent film thereon to form the laminated body.

In the photomask blank, the amount of warpage change in the functional transparent film after a photomask manufacturing process ends is within ±0.05 μm, and thus the amount of warpage change when manufacturing a photomask can be reduced.

The amount of warpage change is a measurement value within a rectangular region in which one side is 132 mm that is centered on a middle of a principal surface of the photomask blank.

According to one aspect, the functional transparent film includes a halftone phase shift film.

A method of manufacturing a photomask blank according to the present invention is a method of manufacturing a photomask blank in which a laminated body including at least one kind of functional transparent film is formed on a substrate that is transparent to exposure light, the method including: a step of depositing at least one kind of functional transparent film on the substrate; a step of performing a flash irradiation treatment in a case where an absolute value of a warpage amount on the substrate of the functional transparent film is 0.1 μm or more; and a step of forming a layer of a functional film that is different to the functional transparent film thereon to form the laminated body; the method further including a step of performing a heat treatment at least one time after any one of the three steps.

Preferably, the heat treatment is performed within a temperature range of 260° C. to 320° C. for four hours or more.

In addition, preferably, in the step of performing the flash irradiation treatment, a time period of a single irradiation is one second or less.

Further, preferably, the heat treatment and the flash irradiation treatment are performed under conditions such that a warpage amount on the substrate of the functional transparent film after the step of performing the heat treatment and the step of performing the flash irradiation treatment is within ±0.05 µm.

A warpage amount on the substrate of the laminated body that includes the functional transparent film is a measurement value within a rectangular region in which one side is 132 mm that is centered on a middle of a principal surface of the photomask blank.

According to one aspect, the laminated body includes a halftone phase shift film.

According to the present invention, a heat treatment is performed at least one time after any one of: a step of depositing a functional transparent film, a step of performing a flash irradiation treatment at least one time after deposition of the functional transparent film, and a step of forming a layer of a functional film that is different to the functional transparent film thereon to form a laminated body. Hence, the release of stress of a functional transparent film within which stress has accumulated is effectively performed. As a result, it is possible to provide a photomask blank that has a high degree of flatness (that is, has little warpage) and in which the amount of warpage change after a photomask manufacturing process ends is also small.

DETAILED DESCRIPTION OF THE PREFERRED EMBODIMENTS

Hereunder, a photomask blank and a method of manufacturing a photomask blank according to the present invention are described with reference to the drawings.

As described above, in order to accurately form a minute pattern, it is necessary to enhance the superposition accuracy of a photomask and the like, and it is necessary to suppress to a small amount the amount of warpage change that arises during a process of manufacturing a photomask with a photomask blank. The present inventors conducted studies regarding this problem, and found that to effectively release stress from a laminated body including a functional transparent film within which stress has accumulated, it is effective to perform a heat treatment in addition to performing flash irradiation with respect to the functional transparent film.

That is, according to a method of manufacturing a photomask blank according to the present invention, when manufacturing a photomask blank in which a laminated body including at least one kind of functional transparent film is formed on a substrate that is transparent to exposure light, a heat treatment is performed at least one time after performing any one of the following three steps: a step of depositing at least one kind of functional transparent film on the substrate; a step of performing a flash irradiation treatment in a case where an absolute value of a warpage amount on the substrate of the functional transparent film is 0.1 µm or more; and a step of forming a layer of a functional film that is different to the functional transparent film thereon to form the laminated body. Although an upper limit of the absolute value of the warpage amount on the substrate of the functional transparent film is not particularly specified, it has been confirmed that there is an effect even when the absolute value of the warpage amount is 0.4 µm.

Figure 1:
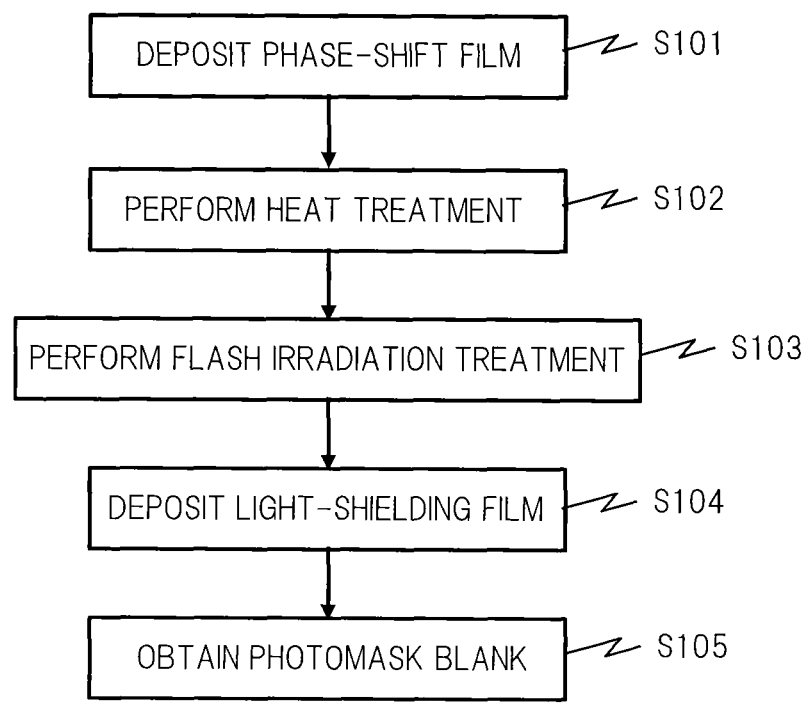
FIG. 1 is a flowchart for describing an example of a manufacturing process of a photomask blank according to the present invention (heat treatment and flash irradiation treatment on a functional transparent film)

FIG. 1 is a flowchart for describing an example of a manufacturing process of a photomask blank according to the present invention. FIG. 1 illustrates an example of manufacturing a photomask blank in which a laminated body including a phase shift film as a functional transparent film and a light-shielding film as another functional film is formed on a substrate that is transparent to exposure light. In FIG. 1, a process flow is illustrated for a case where, among the aforementioned films, an absolute value of a warpage amount on the substrate of the phase shift film is 0.1 µm or more, and a heat treatment and a flash irradiation treatment are each executed one time to release stress in the phase shift film.

First, a phase shift film is deposited (S101). Next, the phase shift film is subjected to a heat treatment (S102), and thereafter is subjected to a flash irradiation treatment (S103). A light-shielding film is deposited on the phase shift film that has undergone the aforementioned stress release treatments (S104), and a photomask blank is obtained (S105).

The conditions and the like under which to perform the heat treatment and the flash irradiation treatment are described later, and various modes are possible with respect to the stage at which and the manner in which these treatments are performed.

Figure 2:
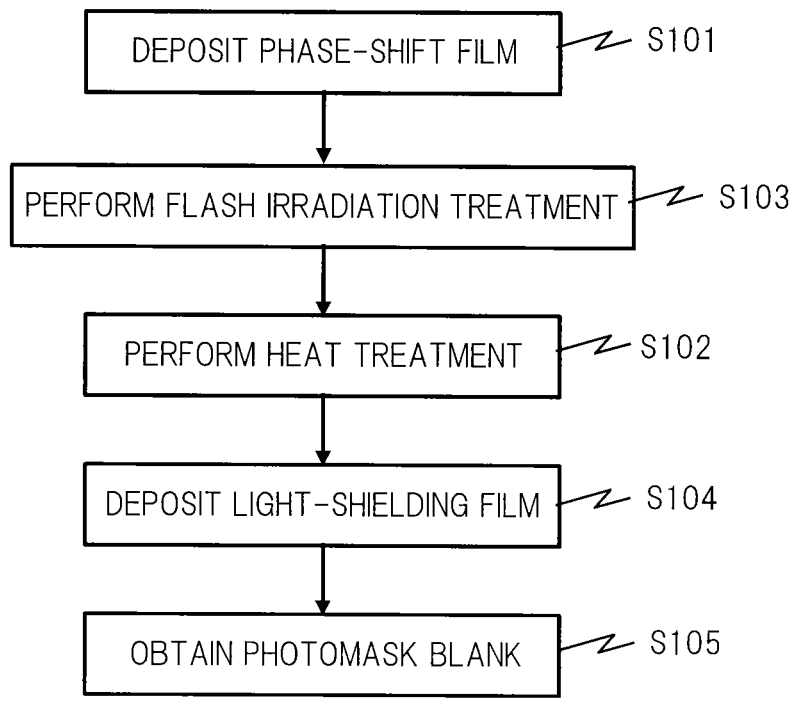
FIG. 2 is a flowchart for describing an example of a manufacturing process of a photomask blank according to the present invention (flash irradiation treatment and heat treatment on a functional transparent film)

FIG. 2 is a flowchart for describing another example of a manufacturing process of a photomask blank according to the present invention. According to FIG. 2, first, a phase shift film is deposited (S101). Next, the phase shift film is subjected to a flash irradiation treatment (S103) and a heat treatment (S102). A light-shielding film is deposited on the phase shift film that has undergone the aforementioned stress release treatments (S104), and a photomask blank is obtained (S105).

Figure 3:
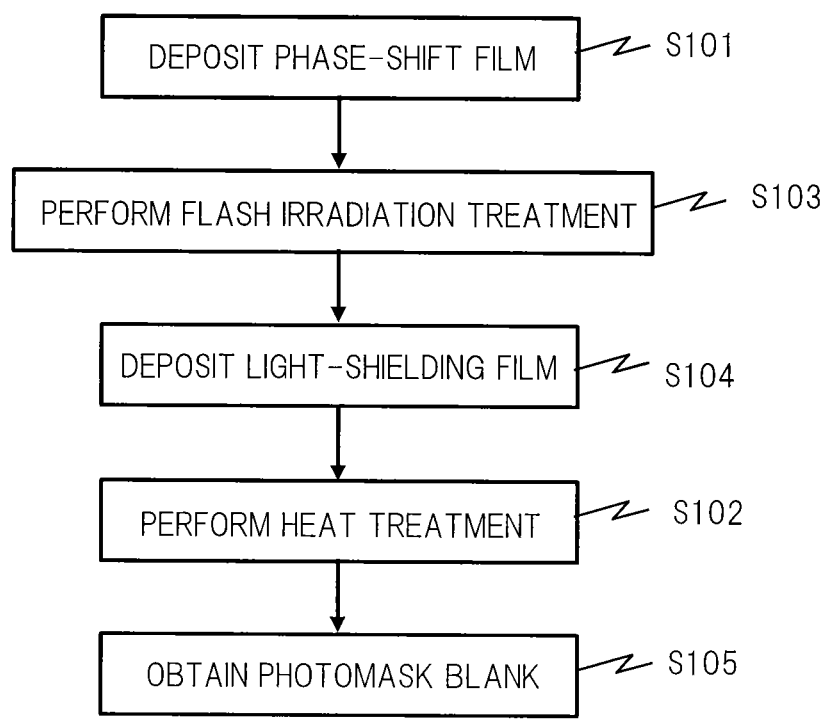
FIG. 3 is a flowchart for describing an example of a manufacturing process of a photomask blank according to the present invention (flash irradiation treatment on a functional transparent film, and heat treatment after formation of another functional film).

FIG. 3 is a flowchart for describing a further example of a manufacturing process of a photomask blank according to the present invention. According to FIG. 3, first, a phase shift film is deposited (S101). Next, the phase shift film is subjected to a flash irradiation treatment (S103), and thereafter a light-shielding film is deposited to obtain a laminated body (S104). The laminated body is subjected to a heat treatment (S102), and a photomask blank is obtained (S105).

The aforementioned heat treatment is preferably executed within a temperature range of 260° C. to 320° C. for two hours or more, and more preferably is executed for four hours or more. If the treatment temperature is lower than 260° C., release of stress inside the functional transparent film will be insufficient, while if the treatment temperature is higher than 320° C. there is a risk that stress of an amount equal to or greater than the released stress will be accumulated. More preferably the temperature range is from 285° C. to 315° C. By performing a heat treatment at such a temperature, the amount of warpage change in a substrate produced by a heat history applied when forming a resist pattern can be suppressed to within a range of ±0.05 µm, and more preferably ±0.03 µm.

Note that, although an inert gas such as nitrogen is the basic atmosphere for the heat treatment, in the case of performing the heat treatment after forming the laminated body, for example, if the heat treatment is conducted in an atmosphere in which an oxygen content in nitrogen gas is between 16% and 24%, the outermost surface can be moderately oxidized and the chemical resistance can be enhanced. If the oxygen content in the atmosphere is lower than 16%, the chemical resistance enhancement effect will be insufficient, while if the oxygen content exceeds 24% there is a risk that surface roughness may arise.

With regard to the flash irradiation treatment, if the time period of a single irradiation is too long, there is a risk that the shape of the substrate itself will change. Therefore, the time period of a single irradiation is preferably one second or less, more preferably is 10 milliseconds or less, and further preferably is 1 millisecond or less. Note that the lower limit of the time period of a single irradiation is normally 0.1 milliseconds. Further, the flash irradiation is preferably executed in a state in which the substrate is maintained at a temperature between 50° C. and 300° C. The reason for heating in this manner during the flash irradiation treatment is to stabilize a process that keeps the temperature inside the chamber constant when performing consecutive flash irradiation treatments.

The absorption efficiency with respect to flash light varies for each functional transparent film that is an object for stress release. Therefore, it is necessary to adjust according to the composition of the functional transparent film and the like to obtain the appropriate flash irradiation energy density.

Based on the results of studies conducted by the present inventors, it was found that when the functional transparent film is a halftone phase shift film, an appropriate flash irradiation energy density range is from 5.5 J/cm$^2$ to 16.5 J/cm$^2$ when the halftone phase shift film has a transmittance of 5% to 7% with respect to KrF excimer laser light.

An appropriate flash irradiation energy density range is from 16.8 J/cm$^2$ to 31.0 J/cm$^2$ when the halftone phase shift film has a transmittance of 18% to 32% with respect to KrF excimer laser light.

An appropriate flash irradiation energy density range is from 14.7 J/cm$^2$ to 27.5 J/cm$^2$ when the halftone phase shift film has a transmittance of 5% to 7% with respect to ArF excimer laser light.

An appropriate flash irradiation energy density range is from 21.0 J/cm$^2$ to 36.0 J/cm$^2$ when the halftone phase shift film has a transmittance of 18% to 32% with respect to an ArF excimer laser light.

The atmosphere for flash irradiation may be an inert gas such as argon, nitrogen, or a mixed gas containing two or more of an inert gas such as argon, nitrogen, and oxygen. In addition, flash irradiation may also be performed in vacuum or in air. From the viewpoint of preventing scattering of particles, it is preferable to perform flash irradiation in vacuum.

When performing flash irradiation treatment in the practice of the present invention, irradiation of the film may be completed in a single flash or may be divided into a plurality of flashes.

In FIG. 1 to FIG. 3, although examples are illustrated in which the heat treatment (S102) and the flash irradiation treatment (S103) are performed one time each, the heat treatment and the flash irradiation treatment may be performed a plurality of times.

A substrate made of synthetic quartz glass, calcium fluoride or the like can be mentioned as an example of the substrate that is transparent to exposure light.

The kinds of functional transparent films deposited on the substrate that is transparent to exposure light include, for example, an etching stopper film that is transparent to light from a flash lamp and a phase shift film. The kinds of the other functional film include a light-shielding film that has a light shielding effect with respect to light from a flash lamp and an antireflection film. The photomask blank includes a laminated body that includes at least one kind of these functional transparent films and a functional film (other functional film) that is different to the functional transparent film.

These functional transparent films are semi-transparent to flash light. At the time of a flash irradiation treatment, the relevant functional transparent film can absorb part of the flash light and reduce the stress of the film.

In the laminated body including a functional transparent film and another functional film that is formed on the substrate, the total of the respective optical densities with respect to the exposure wavelength of the functional films constituting the laminated body is preferably 2.5 or more, and more preferably is 3.0 or more.

Although a known method can be used for depositing the functional film on the substrate, deposition by sputtering is preferable. When it is necessary for the film to contain a light element such as oxygen, nitrogen or carbon, a reactive sputtering method is preferable. Note that, the sputtering gas can be an inert gas such as argon to which oxygen, nitrogen, or a gas containing oxygen, nitrogen or carbon such as nitrogen oxides or carbon oxides or the like is added.

The sputtering process may employ either a direct-current (DC) power supply or a radio-frequency (RF) power supply. Either a magnetron sputtering system or a conventional sputtering system may be used. The film deposition apparatus may be a passing type or a sheet type.

In a case where the functional transparent film is a halftone phase shift film, generally, the halftone phase shift film can be classified into a low-transmittance type that has a transmittance of around 6% with respect to the exposure wavelength and a high-transmittance type that has a transmittance between 18% and 32% with respect to the exposure wavelength.

The halftone phase shift film may be an amorphous silicon film, a metal compound film containing oxygen, nitrogen or carbon or the like. In general, a halftone phase shift film that includes one or more layers containing silicon, a metal other than silicon, and one or more kinds of elements selected from among oxygen, nitrogen and carbon is preferable.

Examples of the metal other than silicon contained in the halftone phase shift film include W, Mo, Ti, Ta, Zr, Hf, Nb, V, Co, Cr and Ni. Of these, a film based on Mo has excellent chemical resistance and has a significant effect with respect to reducing in-film stress. Specific examples thereof include a halftone phase shift film composed of molybdenum silicide oxide (MoSiO), molybdenum silicide nitride (MoSiN), molybdenum silicide carbide (MoSiC), molybdenum silicide oxynitride (MoSiON), molybdenum silicide oxycarbide (MoSiOC), or molybdenum silicide oxynitride carbide (MoSiONC).

Preferably the thickness of the halftone phase shift film is normally in the range of 30 to 200 nm, and a range of 50 to 130 nm is particularly preferable, although the range varies depending on the exposure wavelength when using the halftone phase shift mask, the transmittance of the phase shift film, the phase shift amount and the like.

The aforementioned heat treatment step and flash irradiation treatment step are performed under conditions such that a warpage amount on the substrate of the functional transparent film after performing both steps is within ±0.05 µm. The amount of warpage change in a halftone phase shift film of a phase shift mask obtained by the above described manufacturing method can be suppressed to within ±0.05 µm.

EXAMPLES

Hereunder, the manufacturing method for a photomask blank according to the present invention is described in detail by way of examples and a comparative example.

[Phase-Shift Film Deposition]

A halftone phase shift film composed of MoSiON with a thickness of 750 Å was deposited on a 6-inch square quartz substrate with a thickness of 0.25 inches by a reactive DC sputtering technique as a functional transparent film. The composition of the MoSiON film was adjusted so as to provide a phase difference of approximately 180° and a transmittance of approximately 5% when employing an ArF excimer laser (wavelength 193 nm) as exposure light. The specific film formation conditions are described hereunder.

Argon, oxygen and nitrogen was used as the sputtering gas, and the gas pressure inside the chamber was adjusted to 0.05 Pa. Two kinds of targets, namely, an Mo target and an Si target, were used as targets and film deposition was performed while rotating the substrate at 30 rpm. On ESCA analysis, the halftone phase shift film had a composition of Mo:Si:O:N=1:4:1:4 (atomic ratio).

Warpage on the substrate after the MoSiON film was deposited was evaluated within a rectangular region in which one side was 132 mm that was centered on the middle of a principal surface of the substrate. The MoSiON film was formed in a concave shape with respect to the substrate side, strain accumulated in the film was compressive stress, and a warpage amount was −0.4 μm. Note that, hereunder, a functional transparent film formed in a concave shape with respect to the substrate side may be described as a film in which compressive stress is accumulated, while a functional transparent film formed in a convex shape with respect to the substrate side may be described as a film in which tensile stress is accumulated.

Example 1

In a state in which the substrate on which the above described MoSiON film was deposited was maintained at a temperature of 80° C., light from a flash lamp was irradiated under conditions such that warpage of the MoSiON film was within ±0.05 μm (S103). The flash energy density at that time was 19 J/cm$^2$ per unit area, and irradiation time periods were from 0.1 to 10 msec. Control of the flash energy density was performed by adjusting a voltage applied to the lamp.

Subsequently, heat treatment was performed for 6 hours at 300° C. (S102). The atmosphere at that time was 80% nitrogen and 20% oxygen. At this time, the warpage amount of the halftone phase shift film was +0.03 μm.

After the flash irradiation treatment and heat treatment, a chromium-based light-shielding film and a chromium oxide-based antireflection film were laminated onto the MoSiON film (S104), to obtain a halftone phase shift photomask blank (S105).

An EB resist was coated by spin coating to a film thickness of 150 nm on the thus-obtained photomask blank, and pre-baking (100° C. for 10 minutes) was performed to remove solvent remaining in the film.

After exposing this resist film to an electron beam, post-baking (120° C. for 5 minutes) was performed. The resist film was developed in an alkaline aqueous solution of tetramethylammonium hydroxide (TMAH) to form a resist pattern. Heat treatment was performed at 140° C. for 6 minutes after formation of the resist pattern. After resist pattern formation, a pattern was formed on the photomask blank to obtain a halftone-type phase shift mask.

The warpage amount of the halftone phase shift film of the photomask manufactured in this manner was +0.02 μm. That is, the amount of warpage change in the halftone phase shift film after the photomask manufacturing process ended was −0.01 μm. These results are summarized in Table 1.

Example 2

A substrate on which the above described MoSiON film was deposited was subjected to a heat treatment at 300° C. for 6 hours (S102). The atmosphere at this time was 80% nitrogen and 20% oxygen.

Subsequently, in a state in which the MoSiON film was maintained at a temperature of 80° C., light from a flash lamp was irradiated under conditions such that warpage of the MoSiON film was within ±0.05 μm (S103). The flash energy density at this time was 19 J/cm$^2$ per unit area, and irradiation time periods were from 0.1 to 10 msec. At this time, the warpage amount of the halftone phase shift film was +0.02 μm.

Thereafter, a photomask was manufactured by the same steps as in Example 1. The warpage amount of the halftone phase shift film of the photomask was −0.01 μm. That is, the amount of warpage change in the halftone phase shift film after the photomask manufacturing process ended was −0.03 μm. These results are summarized in Table 1.

Comparative Example 1

In a state in which the substrate on which the above described MoSiON film was deposited was maintained at a temperature of 80° C., light from a flash lamp was irradiated under conditions such that warpage of the MoSiON film was within ±0.05 μm. The flash energy density at this time was 19 J/cm$^2$ per unit area, and irradiation time periods were from 0.1 to 10 msec. At this time, the warpage amount of the halftone phase shift film was −0.01 μm.

Thereafter, a photomask was manufactured by the same steps as in Examples 1 and 2. The warpage amount of the halftone phase shift film of the photomask was −0.07 μm. That is, the amount of warpage change in the halftone phase shift film after the photomask manufacturing process ended was −0.06 μm. These results are summarized in Table 1.

TABLE 1

| Example | Treatment | Warpage change amount (μm) |
|---|---|---|
| Example 1 | Flash irradiation treatment + heat treatment | −0.01 |
| Example 2 | Heat treatment + flash irradiation treatment | −0.03 |
| Comparative Example 1 | Flash treatment only | −0.06 |

The above results indicate that, with respect to a laminated body including a functional transparent film in which stress has accumulated, the amount of change in the stress can be reduced by also performing a heat treatment in addition to flash irradiation.

As described above, according to the present invention, a heat treatment and a flash irradiation treatment are each performed at least one time with respect to a laminated body including a functional transparent film in which stress has accumulated. As a result, it is possible to provide a photomask blank with a high degree of flatness (that is, with little warpage) and in which the amount of warpage change after a photomask manufacturing process ends is also small.

What is claimed is:

1. A photomask blank in which a laminated body comprising at least one kind of functional transparent film is formed on a substrate that is transparent to exposure light, wherein:
    a flash irradiation treatment is performed at least one time after deposition of the functional transparent film, where a time period of a single irradiation is one second or less; and
    a heat treatment is performed on the laminated body at least one time after the flash irradiation treatment is performed, where the heat treatment is performed within a temperature range of 260° C. to 320° C. for four hours or more.

2. The photomask blank according to claim 1, wherein the functional transparent film comprises a halftone phase shift film.

3. The photomask blank according to claim 1, wherein, in the photomask blank, an amount of warpage change in the functional transparent film after a photomask manufacturing process ends is within ±0.05 μm.

4. The photomask blank according to claim 3, wherein the functional transparent film comprises a halftone phase shift film.

5. The photomask blank according to claim 3, wherein the amount of warpage change is a measurement value within a rectangular region in which one side is 132 mm that is centered on a middle of a principal surface of the photomask blank.

6. The photomask blank according to claim 5, wherein the functional transparent film comprises a halftone phase shift film.

7. A method of manufacturing a photomask blank in which a laminated body comprising at least one kind of functional transparent film is formed on a substrate that is transparent to exposure light, comprising:
    a step of depositing at least one kind of functional transparent film on the substrate;
    a step of performing a flash irradiation treatment in a case where an absolute value of a warpage amount on the substrate of the functional transparent film is 0.1 μm or more; and
    a step of forming a layer of a functional film that is different to the functional transparent film thereon to form the laminated body;
    the method further comprising a step of performing a heat treatment at least one time after any one of the three steps, wherein
    in the step of performing the flash irradiation treatment, a time period of a single irradiation is one second or less, and
    the heat treatment is performed within a temperature range of 260° C. to 320° C. for four hours or more.

8. The method of manufacturing a photomask blank according to claim 7, wherein the heat treatment and the flash irradiation treatment are performed under conditions such that a warpage amount on the substrate of the functional transparent film after the step of performing the heat treatment and the step of performing the flash irradiation treatment is within ±0.05 μm.

9. The method of manufacturing a photomask blank according to claim 7, wherein a warpage amount on the substrate of the laminated body comprising the functional transparent film is a measurement value within a rectangular region in which one side is 132 mm that is centered on a middle of a principal surface of the photomask blank.

10. The method of manufacturing a photomask blank according to claim 7, wherein the functional transparent film comprises a halftone phase shift film.

* * * * *

UNITED STATES PATENT AND TRADEMARK OFFICE
CERTIFICATE OF CORRECTION

| | |
|---|---|
| PATENT NO. | : 9,063,427 B2 |
| APPLICATION NO. | : 13/790769 |
| DATED | : June 23, 2015 |
| INVENTOR(S) | : Souichi Fukaya |

Page 1 of 1

It is certified that error appears in the above-identified patent and that said Letters Patent is hereby corrected as shown below:

On the title page, Items (71), the Applicant's information and (73), the Assignee's information are incorrect. Items (71) and (73) should read:

-- (71) Applicant: Shin-Etsu Chemical Co., Ltd., Tokyo, (JP) --

-- (73) Assignee: SHIN-ETSU CHEMICAL CO., LTD., Tokyo, (JP) --

Signed and Sealed this
Third Day of November, 2015

Michelle K. Lee
*Director of the United States Patent and Trademark Office*